(12) United States Patent
Wang et al.

(10) Patent No.: US 10,691,025 B2
(45) Date of Patent: Jun. 23, 2020

(54) REACTION FORCE DIVERSION MECHANISM, MOTOR DEVICE AND PHOTOLITHOGRAPHY MACHINE

(71) Applicant: SHANGHAI MICRO ELECTRONICS EQUIPMENT (GROUP) CO., LTD., Shanghai (CN)

(72) Inventors: Baoliang Wang, Shanghai (CN); Fuqiang Yang, Shanghai (CN); Yuebin Zhu, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/024,200

(22) Filed: Jun. 29, 2018

(65) Prior Publication Data

US 2019/0004433 A1    Jan. 3, 2019

(30) Foreign Application Priority Data

Jun. 30, 2017 (CN) .......................... 2017 1 0524606

(51) Int. Cl.
G03B 27/54 (2006.01)
G03F 7/20 (2006.01)

(52) U.S. Cl.
CPC ...... *G03F 7/70191* (2013.01); *G03F 7/70733* (2013.01); *G03F 7/70766* (2013.01)

(58) Field of Classification Search
CPC ............. G03F 7/70191; G03F 7/70733; G03F 7/70766; G03F 7/70716; G03F 7/709
See application file for complete search history.

(56) References Cited

U.S. PATENT DOCUMENTS 6,472,840 B1 * 10/2002 Takahashi ............. F16F 7/1005
                                                    318/611
2004/0252287 A1 * 12/2004 Binnard .............. G03F 7/70716
                                                    355/53

FOREIGN PATENT DOCUMENTS

CN    203256773 U    10/2013
CN    103472678 A    12/2013
CN    104678711 A     6/2015
(Continued)

OTHER PUBLICATIONS

Machine translation of JP 2000-133573, May 12, 2000.*

*Primary Examiner* — Peter B Kim
(74) *Attorney, Agent, or Firm* — Muncy, Geissler, Olds & Lowe, P.C.

(57) ABSTRACT

A reaction force diversion mechanism, a motor device and a photolithography machine are disclosed. The photolithography machine includes an illumination unit, a mask stage, a projection objective, a main baseplate, a wafer stage and a main carrier frame. The illumination unit and the mask stage are disposed above the main baseplate, and the main carrier frame is arranged above a ground base. Both of the wafer stage and the main baseplate are supported on the main carrier frame, and vibration dampers are deployed between the main carrier frame and the ground base. Reaction force diversion mechanisms are disposed between the wafer stage and the ground base and between the mask stage and the ground base. The reaction force diversion mechanisms can divert reaction forces generated from movement of the two motion stages onto the ground base while blocking vibration propagating from the ground base toward the motion stages.

12 Claims, 2 Drawing Sheets

(56) References Cited

FOREIGN PATENT DOCUMENTS

| | | |
|---|---|---|
| CN | 106292193 A | 1/2017 |
| JP | 2000-133573 A | 5/2000 |
| JP | 2004-134745 A | 4/2004 |
| TW | 514983 B | 12/2002 |

* cited by examiner

REACTION FORCE DIVERSION MECHANISM, MOTOR DEVICE AND PHOTOLITHOGRAPHY MACHINE

CROSS-REFERENCES TO RELATED APPLICATIONS

This application claims the priority of Chinese patent application number 201710524606.9, filed on Jun. 30, 2017, the entire contents of which are incorporated herein by reference.

TECHNICAL FIELD

The present invention relates to the field of photolithography and, in particular to a reaction force diversion mechanism, a motor device and a photolithography machine.

BACKGROUND

Photolithography process is critical to the fabrication of semiconductor devices because it allows transferring a series of circuit patterns from photomasks to corresponding ties of chip dies on a wafer through exposure. It is considered as a core step in the manufacturing of large-scale integrated circuits, and a wide range of complex and time-consuming photolithography processes in the fabrication of semiconductor devices are accomplished by suitable photolithography machines.

A photolithography machine incorporates a wafer stage which is configured mainly to support a wafer and carry it to move under a projection objective in coordination with a mask stage so that the wafer is exposed in a desired way. When the wafer and mask stages are moving within an internal frame of the machine, reaction forces resulting from the movement will directly act on the internal frame and may intensify its vibration. If the magnitude of the vibration is too large to satisfy a corresponding performance constraint of the system, satisfactory exposure would not be attained any longer.

In one solution proposed in the prior art for this problem, the stator of a motor for the motion stages is disposed on an external frame so that the reaction forces generated from the movement of the motion stages during exposure directly act on the external frame instead of the internal. This solution, however, is highly demanding on the structural design of the frames and motion stages and tends to increase the complexity of integration of the motion stages into the system.

There are also proposed in the prior art a device for compensating for a reaction force from a motion stage and a photolithography machine in which such devices are incorporated in direct connection with an internal frame. However, due to absence of decoupling mechanisms between the motion stages and shock absorbers, vibration from the ground tends to be introduced during operation of the system, which may pose a direct impact on movement accuracy of the motion stages. In addition, the reaction force compensation devices, deployed on both sides of the wafer stage, have a large footprint which is unfavorable to the layout and maintenance of other subsystems.

SUMMARY OF THE INVENTION

In order to overcome the problems of high process complexity, large footprint and low movement accuracy of the motion stages encountered in the prior art, the present invention provides a reaction force diversion mechanism, a motor device and a photolithography machine.

To this end, the subject matter of the present invention lies in a reaction force diversion mechanism, including a support, a reaction force attenuator and a vibration source connector, which are connected together sequentially. The vibration source connector is connected to a vibration source, with the support in connection with a ground base. The reaction force diversion mechanism is configured to reduce vibration from the vibration source and isolate vibration from the ground base.

Additionally, the reaction force diversion mechanism may further include a support connector and a decoupler, the support connector in connection with the support, the decoupler disposed between the support connector and the reaction force attenuator, the decoupler configured to isolate the vibration from the ground base.

Additionally, the reaction force attenuator may include a connecting block, reaction force diversion dampers, a reaction force diversion spring and a connecting arm, the connecting block in connection with the support connector, each of the reaction force diversion dampers having a first end connected to the connecting block and a second end connected to the vibration source connector, the reaction force diversion spring having a first end connected to the connecting block and a second end connected to a first end of the connecting arm, a second end of the connecting arm in connection with the vibration source connector.

Additionally, the reaction force diversion spring may be connected to the connecting block via a spring guide post.

Additionally, the reaction force diversion spring may be connected to the first end of connecting arm via a preload mount.

The present invention also provides a motor device including the reaction force diversion mechanism as defined above and a motion module in connection with the reaction force diversion mechanism. The reaction force diversion mechanism is also connected to a ground base and is configured to reduce vibration from the motion module and isolate vibration from the ground base.

Additionally, the motion module may include a stator and a mover, wherein the reaction force diversion mechanism is connected to the stator of the motion module.

The present invention also provides a photolithography machine including an illumination unit, a mask stage, a projection objective, a main baseplate, a wafer stage and a main carrier frame, the illumination unit and the mask stage both disposed above the main baseplate, the projection objective disposed between the mask stage and the wafer stage, the main carrier frame disposed above a ground base, the wafer stage and the main baseplate both disposed above the main carrier frame, the main carrier frame and the ground base interposed with vibration dampers, the wafer stage and/or the mask stage and the ground base interposed with reaction force diversion mechanism(s) configured to reduce vibration from the wafer stage and/or the mask stage and isolate vibration from the ground base.

Additionally, the illumination unit may be disposed on an illumination-unit support that is provided on the main baseplate.

Additionally, a vibration absorber may be provided at a side of the illumination-unit support.

Additionally, the vibration absorber may include a support plate, a vibration-absorbing block and a damping member, the support plate fixed to the side of the illumination-unit support in a horizontal orientation, the damping member closely abutting the side of the illumination-unit support, the vibration-absorbing block supported at the bottom on the support plate via jackscrews, the vibration-absorbing block laterally brought into close contact with the side of the illumination-unit support by virtue of preload screws, springs and the damping member.

Additionally, the mask stage may be disposed on a mask-stage support that is provided on the main baseplate.

Additionally, a mask stage measuring system may be further provided on the mask-stage support.

Additionally, each of the reaction force diversion mechanism(s) may include a support in connection with the ground base.

Additionally, the photolithography machine may further include a wafer-stage motor in connection with the wafer stage and a mask-stage motor in connection with the mask stage, wherein each of the reaction force diversion mechanism(s) has a first end connected to the wafer-stage motor or the mask-stage motor and a second end connected to the ground base.

Additionally, each of the reaction force diversion mechanism(s) may further include a support connector, a decoupler, a reaction force attenuator and a vibration source connector, the support connector in connection with the support, the vibration source connector in connection with the wafer-stage motor or the mask-stage motor, the decoupler disposed between the support connector and the reaction force attenuator, the decoupler configured to isolate vibration from the ground base.

Additionally, the reaction force attenuator may include a connecting block, reaction force diversion dampers, a reaction force diversion spring and a connecting arm, the connecting block in connection with the support connector, each of the reaction force diversion dampers having a first end connected to the connecting block and a second end connected to the vibration source connector, the reaction force diversion spring having a first end connected to the connecting block and a second end connected to a first end of the connecting arm, a second end of the connecting arm in connection with the vibration source connector.

Additionally, the reaction force diversion spring may be connected to the connecting block via a spring guide post.

Additionally, the reaction force diversion spring may be connected to the the first end of connecting arm via a preload mount.

Additionally, one reaction force diversion mechanism may be connected to the mask stage and located on one side thereof in a first horizontal direction.

Additionally, two reaction force diversion mechanisms may be connected to the wafer stage and located on one side thereof in a second horizontal direction.

Additionally, a measuring system for the wafer stage may be also provided on the main baseplate.

As noted above, the present invention provides a reaction force diversion mechanism, a motor device and a photolithography machine. The photolithography machine includes an illumination unit, a mask stage, a projection objective, a main baseplate, a wafer stage and a main carrier frame, the illumination unit and the mask stage both on the main baseplate, the projection objective between the mask stage and the wafer stage, the main carrier frame above a ground base, the wafer stage and the main baseplate both on the main carrier frame, the main carrier frame and the ground base interposed with vibration dampers, the wafer and mask stages and the ground base interposed with reaction force diversion mechanisms configured to reduce vibration from the wafer stage and/or the mask stage and isolate vibration from the ground base. The reaction force diversion mechanisms can divert reaction forces generated from movement of the two motion stages onto the ground base while blocking vibration propagating from the ground base toward the motion stages. This makes it possible to minimize overall vibration of the system caused by the reaction forces, significantly decrease the complexity in the design of the whole system and of the motion stages, enhance the control accuracy of the motion stages, effectively reduce the requirements on the vibration dampers and bring down the development difficulty and cost of the vibration dampers. Further, the vibration absorber can provide a significant local vibration damping effect based on a simple structure. Compared to increasing the modal stiffness of the frame, this significantly reduced the design complexity and manufacturing cost. Furthermore, the reaction force diversion mechanism of the present invention has a smaller footprint, allows an easy access for maintenance, is compact and simple in structure and can be easily attached and detached.

In these figures: 1—illumination unit; 2—mask stage; 3—projection objective; 4—main baseplate; 5—wafer stage; 51—marble base for the wafer stage; 6—ground base; 7—main carrier frame; 8—vibration damper; 9—reaction force diversion mechanism; 91—support connector; 92—decoupler; 93—vibration source connector; 94—connecting block; 95—reaction force diversion damper; 96—reaction force diversion spring; 97—connecting arm; 98—spring guide post; 10—illumination-unit support; 11—vibration absorber; 111—support plate; 112—vibration-absorbing block; 113—damping member; 114—jackscrew; 115—preload screw; 116—spring in the vibration absorber; 12—mask-stage support; 13—support; 14—mask stage measuring system; 15—wafer-stage motor; 16—wafer stage measuring system.

DETAILED DESCRIPTION OF EXEMPLARY EMBODIMENTS

The present invention will be described in detail with reference to the accompanying drawings.

Figure 1:
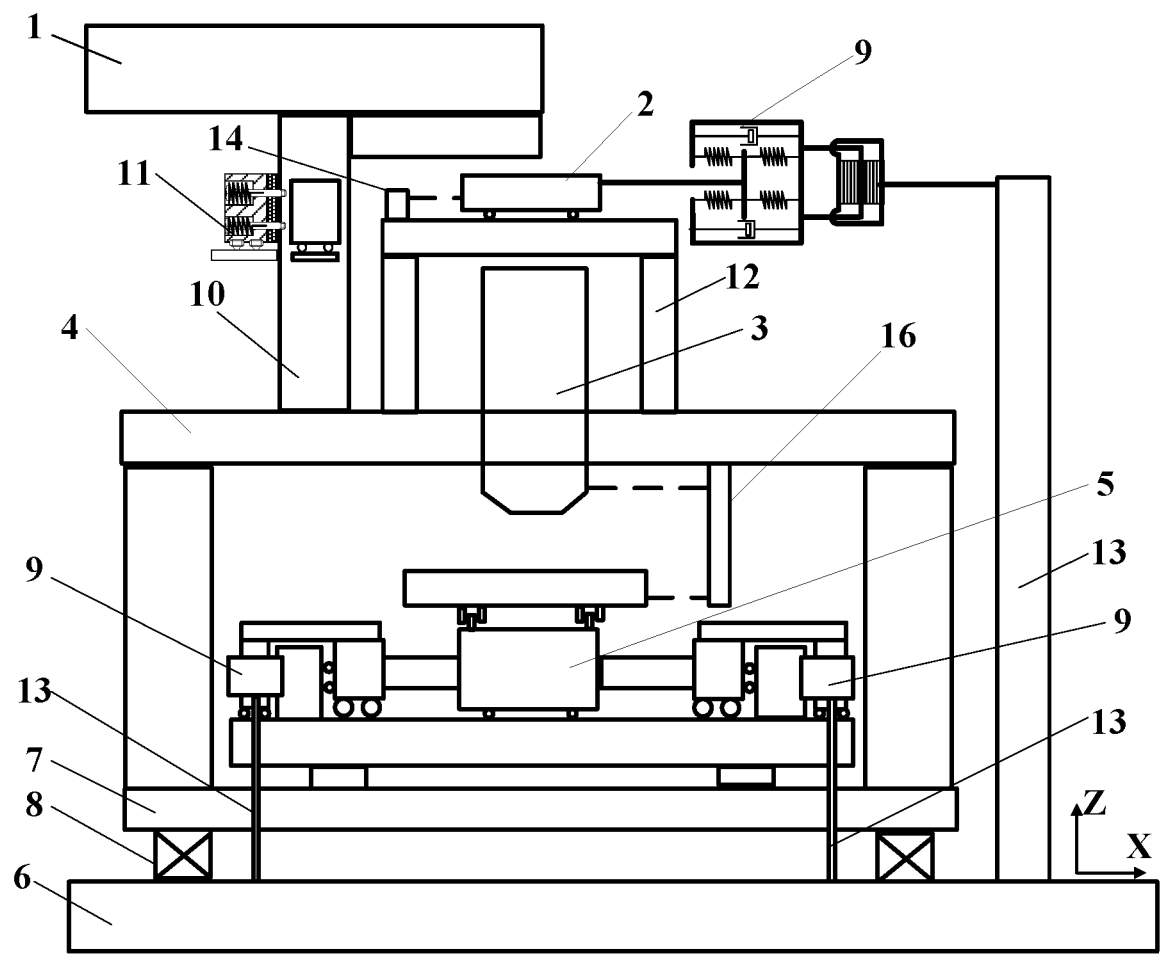
FIG. 1 is a structural schematic of a photolithography machine according to a particular embodiment of the present invention.

As shown in FIG. 1, the present invention provides a photolithography machine including an illumination unit 1, a mask stage 2, a projection objective 3, a main baseplate 4, a wafer stage 5 and a main carrier frame 7. The illumination unit 1 and the mask stage 2 are both disposed above the main baseplate 4. The projection objective 3 is disposed between the mask stage 2 and the wafer stage 5. The main carrier frame 7 is disposed above a ground base 6. The wafer stage 5 and the main baseplate 4 are both disposed above the carrier frame 7. Vibration dampers 8 are disposed between the main carrier frame 7 and the ground base 6. Reaction force diversion mechanisms 9 are disposed between the wafer stage 5 and the ground base 6 as well as between the mask stage 2 and the ground base 6. The reaction force diversion mechanisms 9 are configured to reduce vibration (transferred) from the wafer stage 5 and/or the mask stage 2 and isolate vibration from the ground base 6. Preferably, one of the reaction force diversion mechanisms 9 is provided for the mask stage 2 and located on one side thereof in a first horizontal direction, for example, +X; while another two of the reaction force diversion mechanisms 9 are provided for the wafer stage 5 and located on both sides thereof in a second horizontal direction, for example, −Y. With the reaction force diversion mechanisms 9, reaction force generated from movement of the two motion stages can be diverted to the ground base 6 while blocking vibration propagating from the ground base 6 toward the motion stages. Advantageously, this makes it possible to reduce the overall vibration of the system caused by the reaction forces, significantly lower the complexity in the design of the whole system and of the motion stages and enhance the control accuracy of the motion stages.

Figure 2:
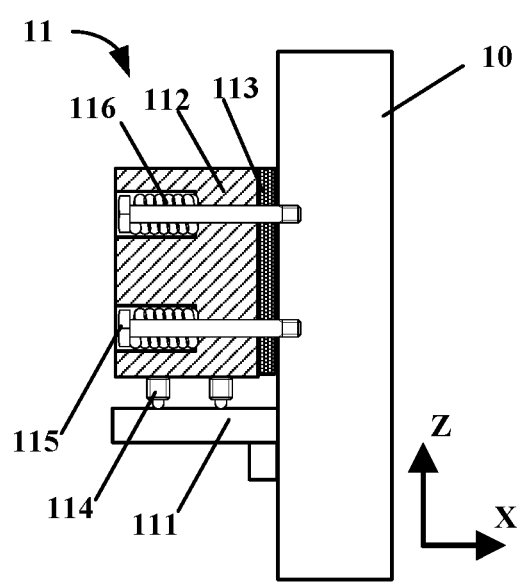
FIG. 2 is a structural schematic of a vibration absorber according to a particular embodiment of the present invention.

Preferably, an illumination-unit support 10 is provided on the main baseplate 4. The illumination unit 1 is disposed on the illumination-unit support 10. A vibration absorber 11 is provided on a side of the illumination-unit support 10. As shown in FIG. 2, the vibration absorber 11 includes a support plate 111, a vibration-absorbing block 112 and a damping member 113. The support plate 111 is fixed to the side of the illumination-unit support 10 in a horizontal orientation and the damping member 113 closely abuts the side of the illumination-unit support 10. The vibration-absorbing block 112 is supported at the bottom on the support plate 111 via jackscrews 114 so that it can move horizontally. Additionally, the vibration-absorbing block 112 is laterally brought into close contact with the side of the illumination-unit support 10 by virtue of preload screws 115, springs 116 and the damping member 113. Specifically, vibration absorber(s) 11 may be arranged on one or more sides of the illumination-unit support 10 where vibration attenuation is needed, so as to mitigate the impact of local vibration of the illumination-unit support 10 occurring due to the illumination unit 1 on the mask stage 2. Simulation results show that the addition of the vibration absorber 11 leads to a shift of approximately 15 dB of the acceleration power spectrum of the illumination-unit support 10 in the X-direction at 44 Hz (which is the first-order frequency of the illumination-unit support 10), marking a significant vibration attenuation effect.

Preferably, also provided on the main baseplate 4 is a mask-stage support 12 on which the mask stage 2 is supported. A mask stage measuring system 14 is further disposed on the mask-stage support 12 for collecting positional information of the mask stage 2.

Preferably, each of the reaction force diversion mechanisms 9 includes a support 13 in connection with the ground base 6. That is, the reaction force diversion mechanism 9 is mounted on the ground base 6 via the support 13. Preferably, the photolithography machine also includes a wafer-stage motor 15 (shown in FIG. 4) in connection with the wafer stage 5 and for actuation thereof and a mask-stage motor (not shown in the figures) in connection with the mask stage 2. Specifically, the reaction force diversion mechanism 9 is connected to the wafer-stage motor 15 or the mask-stage motor at one end and to the ground base 6 at the other end.

Figure 3:
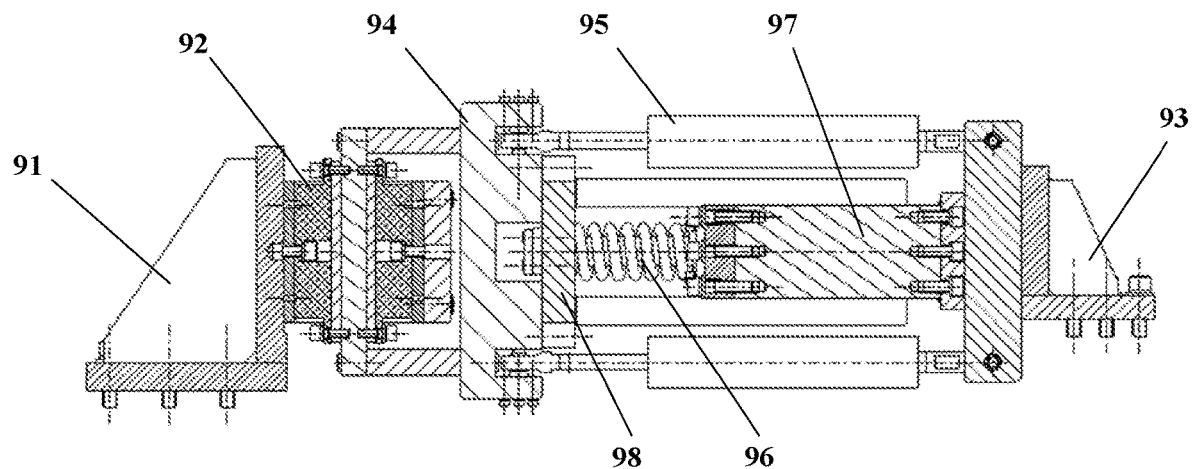
FIG. 3 is a structural schematic of a reaction force diversion mechanism according to a particular embodiment of the present invention.

As shown in FIG. 3, the reaction force diversion mechanism 9 also includes a support connector 91, a decoupler 92, a reaction force attenuator and a vibration source connector 93, which are connected together sequentially. The support connector 91 is connected to the support 13, and the vibration source connector 93 is connected to the wafer-stage motor or the mask-stage motor so as to pass a reaction force from the wafer stage 5 or the mask stage 2 on to the ground base 6 via the support 13.

In embodiments disclosed herein, the decoupler 92 is disposed between the support connector 91 and the reaction force attenuator. The decoupler 92 is preferred to be a stack of rubber sheets capable of isolating vibration from the ground base 6.

Preferably, the reaction force attenuator includes a connecting block 94, reaction force diversion dampers 95, a reaction force diversion spring 96 and a connecting arm 97. The connecting block 94 is connected to the support connector 91. Each of the reaction force diversion dampers 95 is connected to the connecting block 94 at one end and to the vibration source connector 93 at the other end so as to attenuate a reaction force from a corresponding one of the motion stages. The reaction force diversion spring 96 is connected at its respective ends to the connecting block 94 and the connecting arm 97, and the other end of the connecting arm 97 is connected to the vibration source connector 93.

Preferably, the reaction force diversion spring 96 is connected to the connecting block 94 via a spring guide post 98.

Preferably, also provided on the main baseplate 4 is a wafer stage measuring system 16 for collecting positional information of the wafer stage 5.

Figure 4:
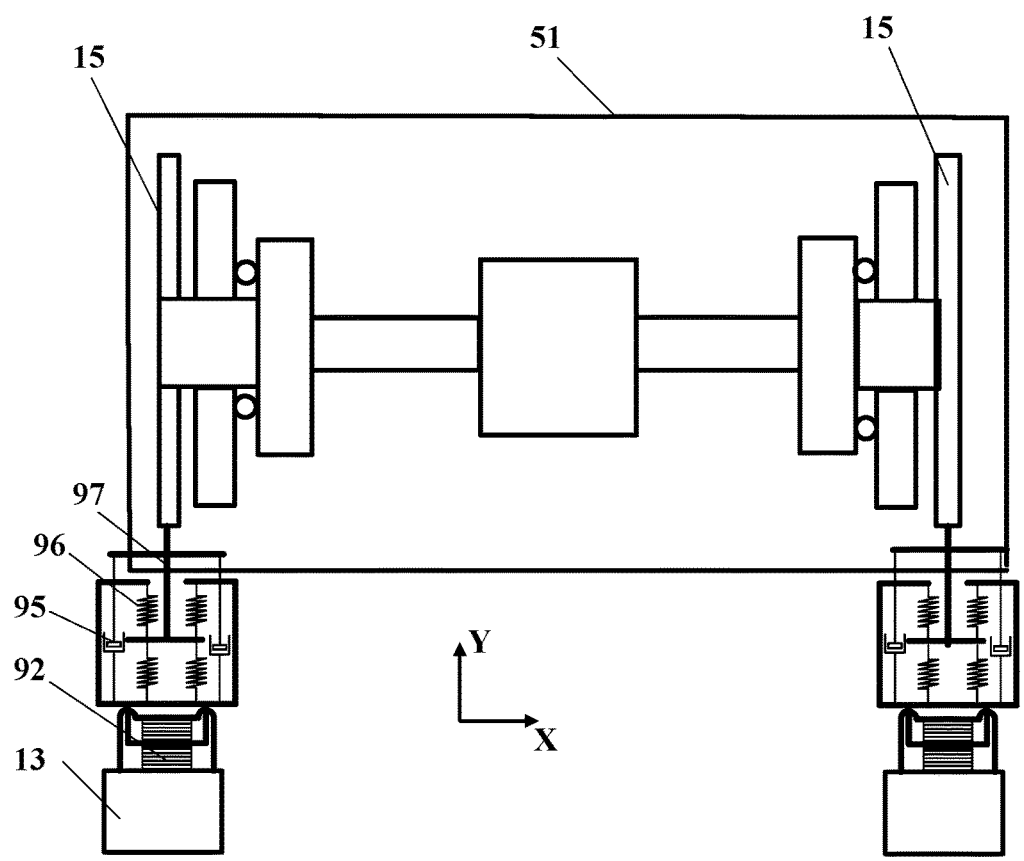
FIG. 4 schematically illustrates how reaction force diversion mechanisms are connected to a wafer stage in accordance with a particular embodiment of the present invention.

With combined reference to FIGS. 1 to 4, in which FIG. 4 shows how the reaction force diversion mechanisms 9 are connected to the wafer stage 5. A stator of the wafer-stage motor 15 is fixed onto a marble base 51 for the wafer stage via guide rails so that sliding in the second horizontal direction (here, the Y-direction) is made possible. The vibration source connectors 93 are attached to the stator of the wafer-stage motor 15 which can restore its original position under action of the multiple reaction force diversion springs 96 arranged into a parallel configuration with the aid of the connecting arms 97 and the connecting blocks 94. The reaction force diversion dampers 95 that are connected at their ends to the vibration source connectors 93 and the connecting blocks 94 are capable of attenuating reaction forces (transferred) from the wafer stage 5. The decouplers 92 decouple reaction forces in the Y-direction in which the wafer stage 5 makes long strokes from those in other directions and direct these forces away while isolating vibration from the ground base 6. With these components working together, the Y-direction reaction forces from the wafer stage 5 can be diverted to the ground base, thereby lowering the design complexity of the vibration dampers 8 and minimizing the impact of the reaction forces from the movement on the wafer stage measuring system 16. In addition, they are deployed on a single side in the Y-direction, have a small footprint and can be easily detached.

The present invention also provide a reaction force diversion mechanism 9, including a support 13, a reaction force attenuator and a vibration source connector 93, which are sequentially connected together. The vibration source connector 93 is connected to a vibration source and the support 13 is connected to a ground base 6. The reaction force diversion mechanism 9 is configured to reduce vibration from the vibration source and isolate vibration from the ground base 6.

Additionally, the reaction force diversion mechanism 9 may further include a support connector 91 and a decoupler 92. The support connector 91 is connected to the support 13 and the decoupler 92 is disposed between the support connector 91 and the reaction force attenuator. The decoupler 92 is configured to isolate vibration from the ground base 6.

Preferably, the reaction force attenuator includes a connecting block 94, reaction force diversion dampers 95, a reaction force diversion spring 96 and a connecting arm 97. The connecting block 94 is connected to the support connector 91. Each of the reaction force diversion dampers 95 is connected to the connecting block 94 at one end and to the vibration source connector 93 at the other end so as to attenuate a reaction force from a motion stage. The reaction force diversion spring 96 is connected to the connecting block 94 at one end and to the connecting arm 97 at the other end. The other end of the connecting arm 97 is connected to the vibration source connector 93.

Preferably, the reaction force diversion spring 96 is connected to the connecting block 94 via a spring guide post 98.

The present invention also provides a motor device including the aforementioned reaction force diversion mechanism 9 and a motion module in connection with the reaction force diversion mechanism 9. The reaction force diversion mechanism 9 is also connected to a ground base 6. The reaction force diversion mechanism 9 is configured to reduce vibration from the motion module and isolation vibration from the ground base 6.

Preferably, the motion module includes a stator and a mover, and the reaction force diversion mechanism 9 is connected to the stator.

In summary, the present invention provides a reaction force diversion mechanism, a motor device and a photolithography machine. The photolithography machine includes an illumination unit 1, a mask stage 2, a projection objective 3, a main baseplate 4, a wafer stage 5 and a main carrier frame 7. The illumination unit 1 and the mask stage 2 are both disposed above the main baseplate 4. The projection objective 3 is disposed between the mask stage 2 and the wafer stage 5. The main carrier frame 7 is disposed above a ground base 6. The wafer stage 5 and the main baseplate 4 are both disposed above the main carrier frame 7. The main carrier frame 7 and the ground base 6 are interposed with vibration dampers 8. The wafer and mask stages 5, 6 and the ground base 6 are interposed with reaction force diversion mechanisms 9 configured to reduce vibration from the wafer stage 5 and/or the mask stage 6 and isolate vibration from the ground base 6. The reaction force diversion mechanisms can divert reaction forces generated from movement of the two motion stages onto the ground base 6 while blocking vibration propagating from the ground base 6 toward the motion stages. This makes it possible to minimize overall vibration of the system caused by the reaction forces, significantly decrease the complexity in the design of the whole system and of the motion stages, enhance the control accuracy of the motion stages, effectively reduce the requirements on the vibration dampers 8 and bring down the development difficulty and cost of the vibration dampers 8. Further, the vibration absorber 11 can provide a significant local vibration damping effect based on a simple structure. Compared to increasing the modal stiffness of the frame, this significantly reduced the design complexity and manufacturing cost. Furthermore, the reaction force diversion mechanism 9 of the present invention has a smaller footprint, allows an easy access for maintenance, is compact and simple in structure and can be easily attached and detached.

Although a few embodiments of the present invention have been described herein, these embodiments are merely illustrative and should not be construed as limiting the scope of the invention. Various omissions, substitutions and changes made without departing from the spirit of the invention are all intended to be included within the scope thereof.

What is claimed is:

1. A photolithography machine, comprising an illumination unit, a mask stage, a projection objective, a main baseplate, a wafer stage and a main carrier frame, the illumination unit and the mask stage both disposed above the main baseplate, the projection objective disposed between the mask stage and the wafer stage, the main carrier frame disposed above a ground base, the wafer stage and the main baseplate both disposed above the main carrier frame, the main carrier frame and the ground base interposed with vibration dampers, the wafer stage and/or the mask stage and the ground base interposed with reaction force diversion mechanism(s) configured to reduce vibration from the wafer stage and/or the mask stage and isolate vibration from the ground base, wherein the illumination unit is disposed on an illumination-unit support that is provided on the main baseplate, wherein a vibration absorber is provided on a side of the illumination-unit support, wherein the vibration absorber comprises a support plate, a vibration-absorbing block and a damping member, the support plate fixed to the side of the illumination-unit support in a horizontal orientation, the damping member closely abutting the side of the illumination-unit support, the vibration-absorbing block supported at a bottom on the support plate via jackscrews, the vibration-absorbing block laterally brought into close contact with the side of the illumination-unit support by virtue of preload screws, springs and the damping member.

2. The photolithography machine according to claim 1, wherein the mask stage is disposed on a mask-stage support that is provided on the main baseplate.

3. The photolithography machine according to claim 2, wherein a mask stage measuring system is further provided on the mask-stage support.

4. The photolithography machine according to claim 1, wherein one reaction force diversion mechanism is connected to the mask stage and disposed on one side thereof in a first horizontal direction.

5. The photolithography machine according to claim 4, wherein two reaction force diversion mechanisms are connected to the wafer stage and disposed on one side thereof in a second horizontal direction.

6. The photolithography machine according to claim 1, wherein a measuring system for the wafer stage is further provided on the main baseplate.

7. The photolithography machine according to claim 1, wherein each of the reaction force diversion mechanism(s) comprises a support in connection with the ground base.

8. The photolithography machine according to claim 7, further comprising a wafer-stage motor in connection with the wafer stage and a mask-stage motor in connection with the mask stage, wherein each of the reaction force diversion mechanism(s) has a first end connected to the wafer-stage motor or the mask-stage motor and a second end connected to the ground base.

9. The photolithography machine according to claim 8, wherein each of the reaction force diversion mechanism(s) further comprises a support connector, a decoupler, a reaction force attenuator and a vibration source connector, the support connector in connection with the support, the vibration source connector in connection with the wafer-stage motor or the mask-stage motor, the decoupler disposed between the support connector and the reaction force attenuator, the decoupler configured to isolate vibration from the ground base.

10. The photolithography machine according to claim 9 wherein the reaction force attenuator comprises a connecting block, reaction force diversion dampers, a reaction force diversion spring and a connecting arm, the connecting block in connection with the support connector, each of the reaction force diversion dampers having a first end connected to the connecting block and a second end connected to the vibration source connector, the reaction force diversion spring having a first end connected to the connecting block and a second end connected to a first end of the connecting arm, a second end of the connecting arm in connection with the vibration source connector.

11. The photolithography machine according to claim 10, wherein the reaction force diversion spring is connected to the connecting block via a spring guide post.

12. The photolithography machine according to claim 10, wherein the reaction force diversion spring is connected to the first end of the connecting arm via a preload mount.

\* \* \* \* \*